United States Patent
Jang

(10) Patent No.: US 6,730,957 B1
(45) Date of Patent: May 4, 2004

(54) NON-VOLATILE MEMORY COMPATIBLE WITH LOGIC DEVICES AND FABRICATION METHOD THEREOF

(75) Inventor: Wen-Yueh Jang, Hsinchu (TW)

(73) Assignee: Winbond Electronics Corporation, Hsinchu (TW)

(*) Notice: Subject to any disclaimer, the term of this patent is extended or adjusted under 35 U.S.C. 154(b) by 0 days.

(21) Appl. No.: 10/287,711

(22) Filed: Nov. 5, 2002

(51) Int. Cl.[7] ............................................. H01L 29/76
(52) U.S. Cl. ..................... 257/314; 257/315; 257/318; 257/321; 257/324
(58) Field of Search ................................. 257/315, 318, 257/314, 321, 324

(56) References Cited

U.S. PATENT DOCUMENTS

| | | | | |
|---|---|---|---|---|
| 5,768,192 A | * | 6/1998 | Eitan ...................... 365/185.24 |
| 6,465,303 B1 | * | 10/2002 | Ramsbey et al. ............ 438/257 |
| 6,479,862 B1 | * | 11/2002 | King et al. .................. 257/321 |
| 6,524,913 B1 | * | 2/2003 | Lin et al. ..................... 438/261 |
| 6,541,326 B2 | * | 4/2003 | Fujiwara ..................... 438/211 |
| 6,555,436 B2 | * | 4/2003 | Ramsbey et al. ........... 438/279 |
| 6,639,271 B1 | * | 10/2003 | Zheng et al. ............... 257/324 |
| 6,653,190 B1 | * | 11/2003 | Yang et al. ................. 438/258 |

* cited by examiner

Primary Examiner—Richard Elms
Assistant Examiner—Doug Menz
(74) Attorney, Agent, or Firm—Dickinson Wright PLLC

(57) ABSTRACT

A non-volatile memory compatible with logic devices and processes is described. The non-volatile memory has a substrate, a first dielectric layer, a first gate, a second gate, a second dielectric layer, a plurality of spacers and a source/drain. A first active region and a second active region are formed on the substrate. When hot carrier effect occurs near the drain, the second dielectric layer located under the spacers is able to retain electrons so that the non-volatile memory is programmed.

14 Claims, 3 Drawing Sheets

NON-VOLATILE MEMORY COMPATIBLE WITH LOGIC DEVICES AND FABRICATION METHOD THEREOF

FIELD OF THE INVENTION

The present invention generally relates to semiconductor processes and structures, and more particularly, to a non-volatile memory compatible with logic devices and a fabrication method for the same.

BACKGROUND OF THE INVENTION

With the rapid development of semiconductor techniques, system-on-chip (SOC) products are widely used in daily routines and improve the quality of life. Generally, the SOC consists of logic devices and non-volatile memory (NVM). The non-volatile memory is always embedded into the logic devices.

Traditionally, as the non-volatile memory needs to be embedded into the logic devices, one method is using multiple transistors connected to form a single polysilicon non-volatile memory. Such a method has poor density due to large cell size of the NVM. The other method is combined logic device processes and non-volatile memory processes. However, since at least two polysilicon layers need to be deposited, the processes are both too complex and demonstrate high overall manufacturing costs.

Consequently, how to make the non-volatile memory compatible with the logic devices and to create a high-density of the SOC so that both the non-volatile memory and the logic devices are optimized is currently a main issue for semiconductor manufacturers.

SUMMARY OF THE INVENTION

One object of the present invention is to utilize a non-volatile memory compatible with logic devices so that the non-volatile memory is easily embedded into the logic device processes.

A further object of the present invention is to use a non-volatile memory compatible with logic devices so that the non-volatile memory is rapidly programmed by a hot carrier effect induced from impact ionization.

Another object of the present invention is to use a non-volatile memory compatible with logic devices so that the hot carrier effect of the drain is further enhanced to increase impact ionization by the proposed device structure.

According to the above objects, the present invention sets forth a non-volatile memory compatible with logic devices and methods. A substrate has a first active region and a second active region. Thereafter, a first dielectric layer is formed on the first active region and the second active region. A conductive layer is deposited on the first dielectric layer to form a first gate on the first active region and to form a second gate on the second active region, and then the first dielectric layer is partially exposed. A second dielectric layer is deposited on the first dielectric layer such that electrons can be trapped in the second dielectric layer.

A third dielectric layer is formed on the second dielectric layer. An anisotropic etching process is then performed to form spacers adjacent to the first gate and second gate. Finally, conducting an implantation and an annealing step can create a source/drain on the substrate adjoining the spacers to make the non-volatile memory compatible with the logic devices.

Processes of fabricating logic devices allow the non-volatile devices in the first active region to be embedded so that the non-volatile memory is more preferably compatible with the logic devices. Due to the fact that the hot carrier effect occurs near the drain of the first active region, many electrons trapped in the second dielectric layer under the spacers are able to maintain the programming state of the non-volatile memory. Specifically, since a drain electrical field is imposed along the channel region in the first active region, an impact ionization of the hot (high energy) electrons occurs and then a portion of electrons are attracted to the second dielectric layer near the drain side by the gate electric field. Drain current of the programmed transistor will decrease due to higher serial resistance near the drain. The drain current of the programmed transistor will decrease further if the source and the drain are interchanged.

Performing the pocket implantation before forming the spacers preferably generates a higher electrical field near the drain to increase electron impact ionization thus electron-trapping occurs in the second dielectric layer under the spacers. Further, the fact that a LDD (Lightly Doped Drain) formed on the first active region forms a depletion region under the spacers will enhance electron impact ionization rate. When the first gate of the first active region turns on, more electrons are trapped in the second dielectric layer by the hot carrier effect to increase the programming efficiency of the non-volatile memory. In addition, because the electrons will only be trapped in the second dielectric layer near the drain side, if the source and the drain are interchanged, each proposed non-volatile memory cell can store two bits by the electron trapped in the second dielectric layer near both the drain and the source. Because the electrons trapped near the source side during a reading operation will reduce more drain current than that near the drain side, the stored two bits can be read out separately.

In summary, a non-volatile memory compatible with logic devices is provided in the present invention. A great number of electrons are trapped in the second dielectric layer by the hot carrier effect. In addition, two-bit data stored in the second dielectric layer under the spacers are easily read leading to high storage density of the non-volatile memory. More importantly, standard logic device processes are applied to embed the non-volatile memory into the logic devices so that the compatibility of the non-volatile memory and logic devices is readily met for a preferred scalability.

BRIEF DESCRIPTION OF THE DRAWINGS

The foregoing aspects and many of the attendant advantages of this invention will become more readily appreciated as the same becomes better understood by reference to the following detailed description when taken in conjunction with the accompanying drawings, wherein.

DETAILED DESCRIPTION OF THE PREFERRED EMBODIMENT

The present invention is directed to a non-volatile memory compatible with logic devices to improve the shortcomings of the SOC in the prior art. Processes of the logic devices are applied to fabricate the non-volatile memory embedded into the logic devices. Moreover, in the non-volatile memory, a great number of electrons are injected into a dielectric layer adjoining a gate to speed up the programming steps of the non-volatile memory.

Figure 1:
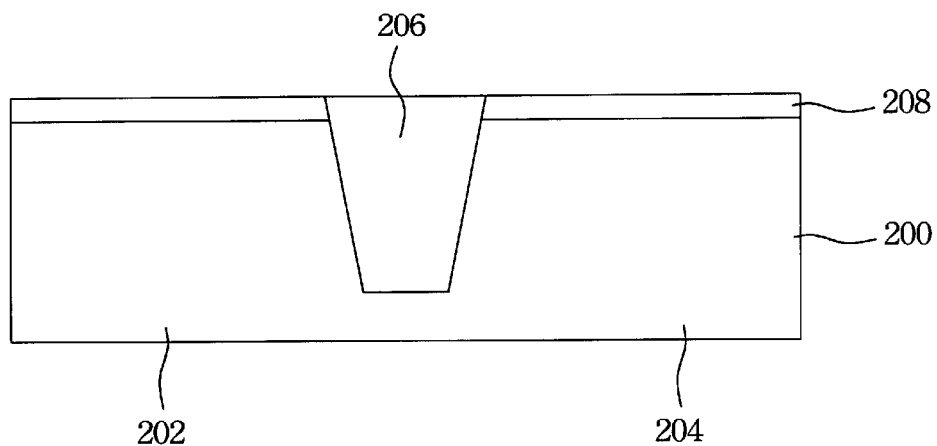
FIGS. 1–9 are schematic, cross-sectional views of a non-volatile memory compatible with logic devices according to the present invention.

FIGS. 1–9 are schematic, cross-sectional views of a non-volatile memory compatible with logic devices according to the present invention. In FIG. 1, a substrate 200 has a first active region 202 and a second active region 204, in which the first active region 202 and the second active region 204 allow formation of a non-volatile memory and a logic device, respectively. An isolated region 206 is preferably located between the first active region 202 and the second active region 204.

Thereafter, a first dielectric layer 208 is formed on the first active region 202 and the second active region 204. For example, performing a thermal oxidation forms the first dielectric layer 208 which includes a material of silicon oxide ($SiO_2$) and has a thickness range of about 12 to 80 angstroms.

Figure 2:
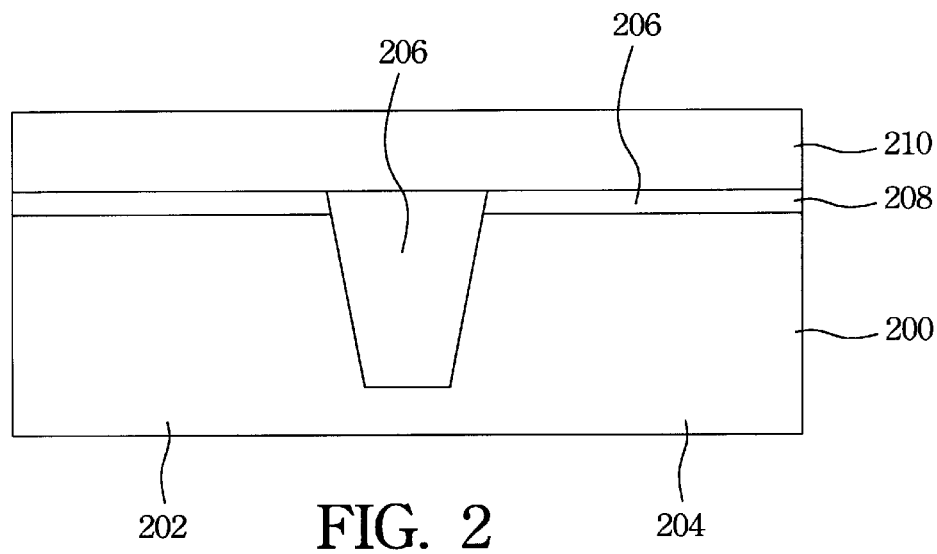

In FIG. 2, forming a conductive layer 210 on the first dielectric layer 208 creates gates of the non-volatile memory and the logic devices. For example, a chemical vapor deposition (CVD) is used to form the conductive layer 210 whose material includes polysilicon or polycide and has a thickness range of about 1000 to 3000 angstroms.

Figure 3:
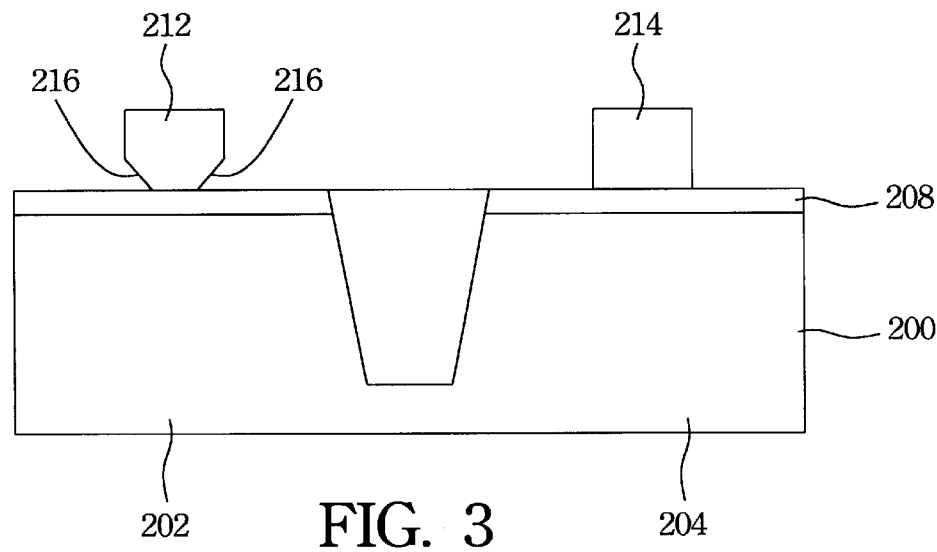

In FIG. 3, conducting a lithography and etching process forms a first gate 212 on the first active region 202 and creates a second gate 214 on the second active region 204, and then the first dielectric layer 208 is partially exposed. In the preferred embodiment of the present invention, when the first gate 212 on the first active region 202 is formed, an anisotropic etching process is carried out to form a vertical sidewall of the first gate 212. The etching reagents used in the anisotropic process comprise HBr, HCl, $O_2$ or combinations thereof.

An isotropic etching process is carried out to form a slant sidewall 216 connected to the vertical sidewall of the first gate 212 to expose a portion of the first dielectric layer 208. The etching reagents of the isotropic etching process comprise HBr, HCl, $O_2$, $SF_6$ or combinations thereof. Further, the flow rate and the bias voltage used in the isotropic etching process are lower than those of the anisotropic process to form an encroachment gate profile.

When the second gate 214 is formed on the second active region 204, an anisotropic etching process is used to form a vertical sidewall of the second gate 214.

Figure 4:
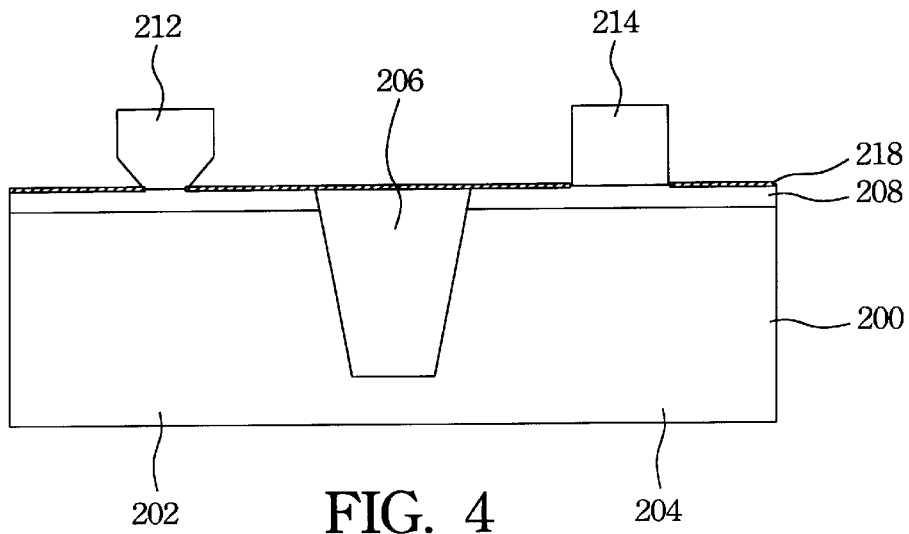

In FIG. 4, a second dielectric layer 218 is formed on the first dielectric layer 208. For example, performing a chemical vapor deposition (CVD) forms the second dielectric layer 218 which includes a material of silicon nitrides ($Si_3N_4$) and oxynitrides ($SiO_xN_y$) and has a thickness range of about 10 to 500 angstroms. Also, the second dielectric layer 218 can be created by a nitride implantation on the source/drain region and the implanting depth of the nitride has a range of about 10 to 300 angstroms.

Figure 5:
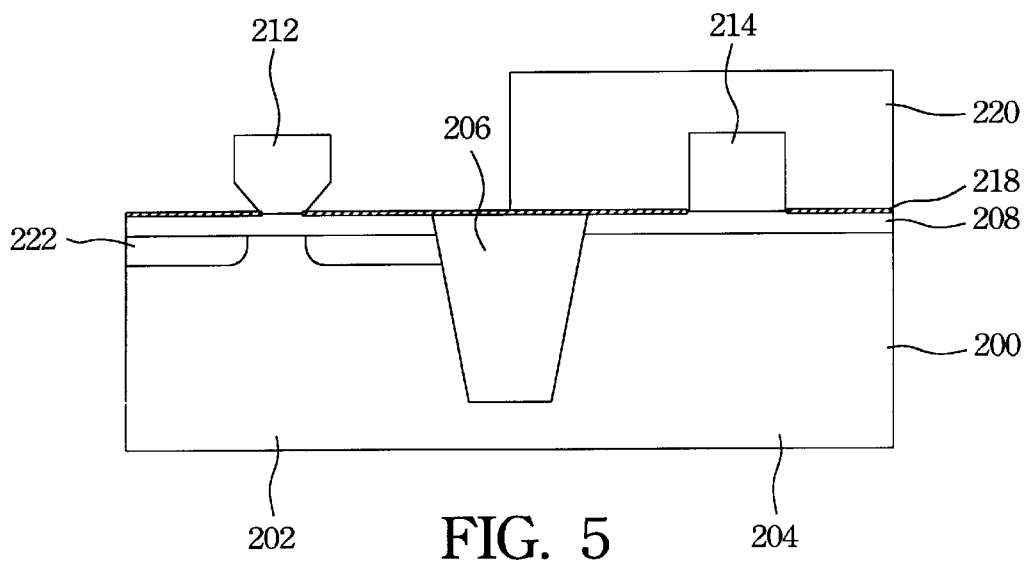

In FIG. 5, a lithography step is performed to expose the first active region 202 and a photoresist layer 220 is deposited on the second dielectric layer 218 and the second gate 214 of the second active region 204. Afterward, a pocket implantation 222 is performed on the second dielectric layer 218 of the first active region 202. In the preferred embodiment of the present invention, the dopant of the pocket implantation 222 includes boron (B) which has an implanting energy range of about 10 to 150 keV and an implanting concentration range of about $1\times10^{13}$ to $5\times10^{14}/cm^2$.

Figure 6:
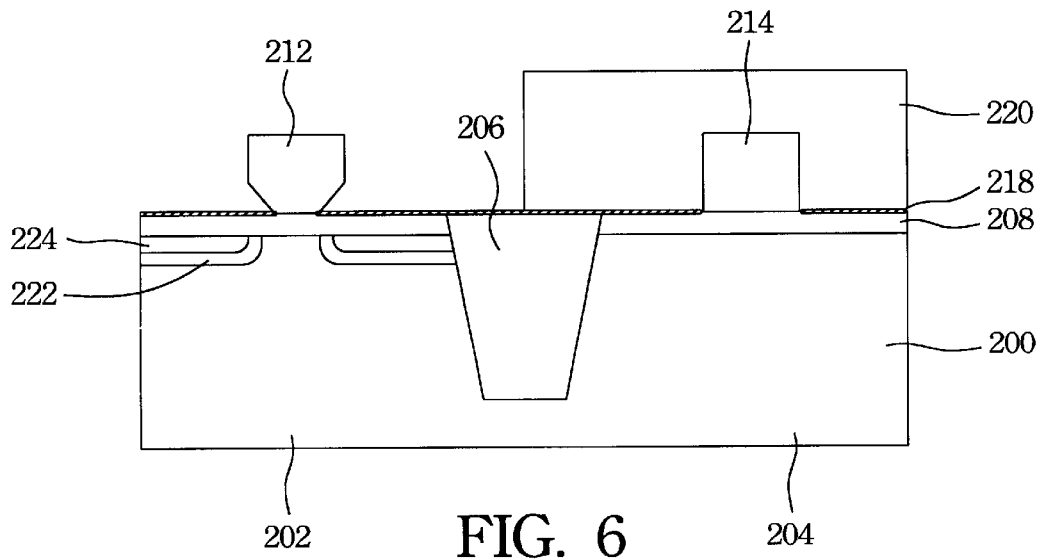

In FIG. 6, a lightly doped drain (LDD) 224 is performed on the substrate 200 of the active region. The dopant of the LDD step includes arsenic (As) which has an implanting energy range of about 5 to 100 keV and an implanting concentration range of about $1\times10^{13}$ to $2\times10^{14}/cm^2$.

Figure 7:
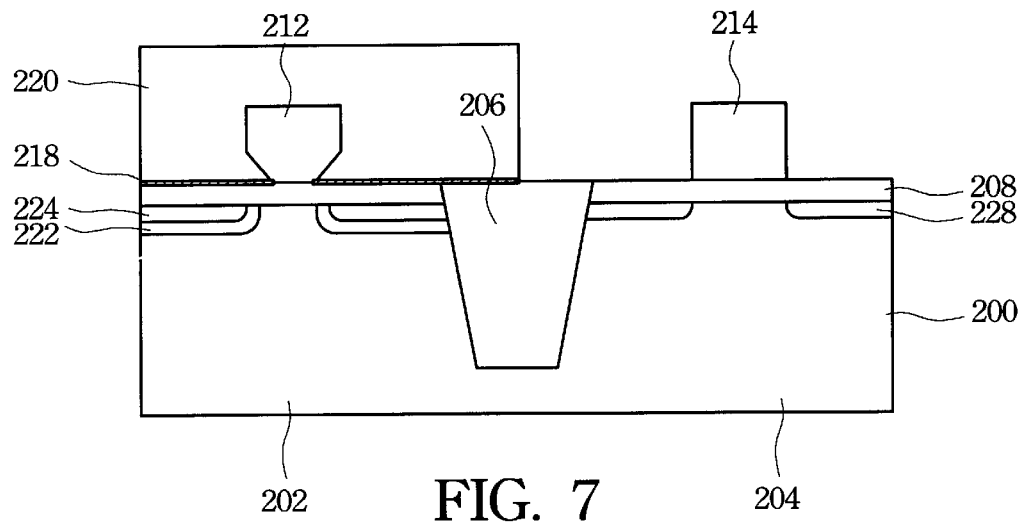

In FIG. 7, a source/region extension 228 is formed on the second active region 204 and a photoresistor layer 220 covers the first active region 202. The dopant of the source/ region extension 228 includes arsenic (As) which has an implanting energy range of about 10 to 150 keV and an implanting concentration range of about $5\times10^{13}$ to $1\times10^{15}/cm^2$ The second dielectric layer 218 on the second active region 204 is then removed.

Figure 8:
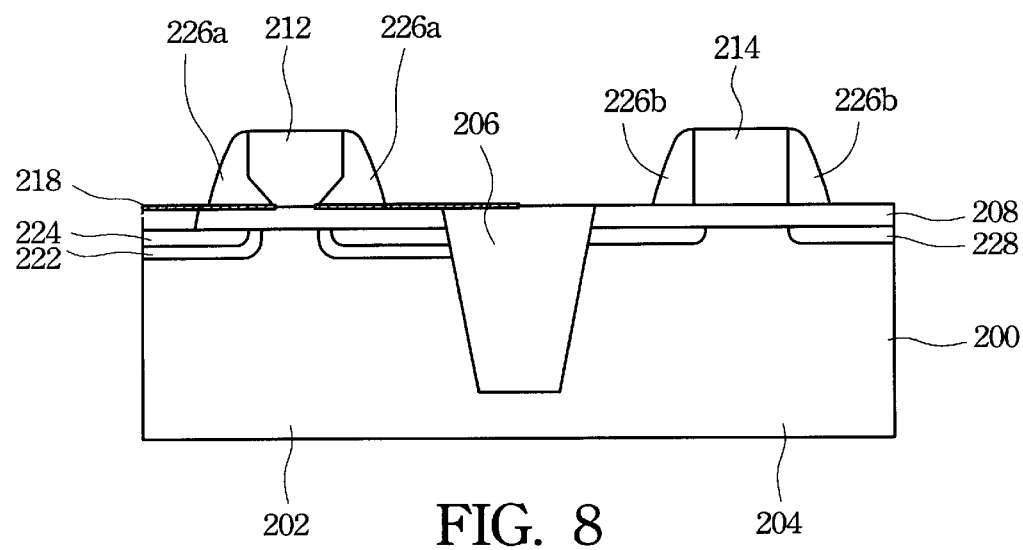

In FIG. 8, a third dielectric layer is formed on the second dielectric. For example, performing a chemical vapor deposition (CVD) forms the third dielectric layer which includes a material of silicon oxide ($SiO_x$) and has a thickness range of about 150 to 2000 angstroms. An anisotropic etching process is then performed to form spacers 226a, 226b adjacent to the first gate 212 and second gate 214. Finally, in FIG. 9, an implantation and an annealing procedure are performed to form a source/drain 230a, 230b on the substrate 200 adjoining the spacers 226a, 226b so that the non-volatile memory compatible with the logic devices is formed.

Figure 9:
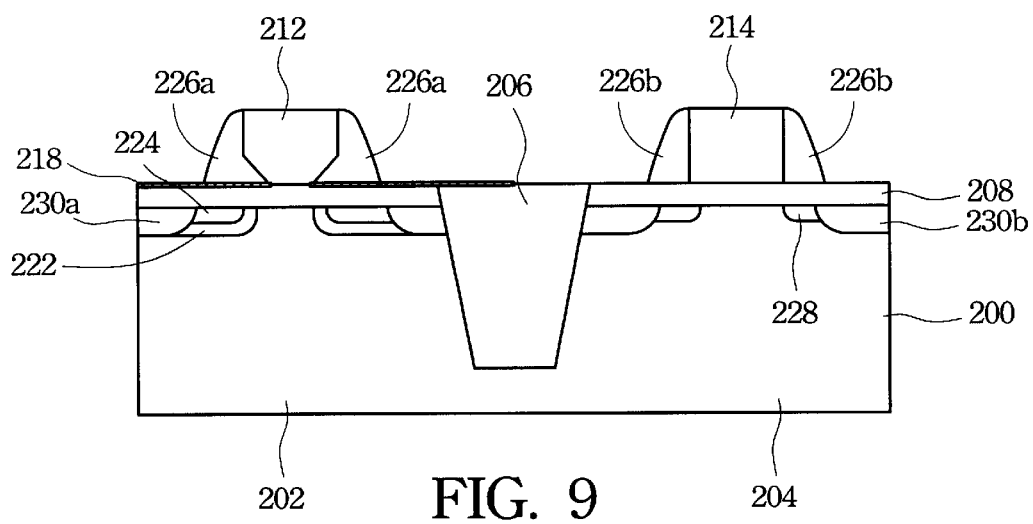

Still referring to FIG. 9, the non-volatile memory accompanies logic device processes makes the non-volatile memory compatible with the logic devices. Specifically, due to the hot carrier effect near the drain 230a of the first active region 202, electrons will be trapped in the second dielectric layer 218 under the spacers 226a during the programming step of the non-volatile memory. Also, since the drain electrical field is applied along the channel region in the first active region 202, an impact ionization of the electrons near the drain 230a occurs so that a portion of electrons is injected into the second dielectric layer 218.

Significantly, a large amount of electrons are retained in the second dielectric layer 218 for the purpose of data storage. Because device size has been reduced greatly as technology has advanced, a channel decrement is magnified to generate a high drain electrical field in the first active region 202 such that more and more hot (high energy) electrons are injected into the second dielectric layer 218.

In the preferred embodiment of the present invention, performing the pocket implantation 222 before forming the spacers 226a generates a higher electrical field near the drain to increase electron impact ionization. Then, there is a higher possibility of these electrons generated by impact ionization to be trapped in the second dielectric layer 218 under the spacers 226a near the drain side. Further, an LDD formed on the first active region 202 is able to form a depletion region near the drain 230b to cover the second dielectric layer 218 under the spacers 226a is also helpful to electrons impact ionization and trapped in the second dielectric layer 218. When the first gate 212 of the first active region 202 turns on for programming, more electrons are trapped in the second dielectric layer 218 by the enhanced hot carrier effect to increase the programming efficiency of the non-volatile memory.

A source/drain extension 228 formed on the second active region 204 of the logic devices reduces the depletion region of the second active region 204 to reduce the serial resistance of the second active region 204 and to improve the device performance when the second gate 214 of the second active region 204 turns on.

According to the preceding analysis, the non-volatile memory compatible with logic devices can trap a great number of electrons in the second dielectric layer 218 efficiently by an enhanced hot carrier effect. With source and drain interchanged during programming, two bits can be saved as electrons trapped in the second dielectric layer near both the drain and source. Drain current reduction during a reading operation can be differentiated by different current reduction for electrons trapped in source and drain. Therefore, two-bit data stored in the second dielectric layer 218 under the spacers can be easily read separately leading to high storage density of the non-volatile memory. More importantly, standard logic device processes are applied to embed the non-volatile memory into the logic devices so that the compatibility of the non-volatile memory and logic devices is readily met for a preferred scalability.

As is understood by a person skilled in the art, the foregoing preferred embodiments of the present invention are illustrative rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A non-volatile memory compatible with logic devices, the non-volatile memory comprising:
   a substrate including a first active region and a second active region, wherein an isolated region is positioned between the first active region and the second active region;
   a first dielectric layer which is located on the first active region and on the second active region, respectively;
   a first gate on the first dielectric layer of the first active region;
   a second gate on the first dielectric layer of the second active region;
   a second dielectric layer located on the first dielectric layer;
   a plurality of spacers adjoining the first gate and the second gate, wherein the second dielectric layer under the spacers is able to trap electrons; and
   a source/drain adjacent to the spacers on the first active and the second active region.

2. The non-volatile memory of claim 1, wherein the first active region comprises a non-volatile memory.

3. The non-volatile memory of claim 1, wherein the second active region comprises a logic device.

4. The non-volatile memory of claim 1, wherein the first gate on the first active region comprises:
   a vertical sidewall; and
   a slant sidewall connected to the vertical sidewall so that a bottom width is smaller than a top width of the first gate along the channel region to enhance hot electron effect.

5. The non-volatile memory of claim 1, wherein the first gate on the first active region comprises a vertical sidewall.

6. The non-volatile memory of claim 1, wherein the second dielectric layer comprises silicon nitrides or oxynitrides.

7. The non-volatile memory of claim 1, wherein the second dielectric layer has a thickness range of about 10 to 100 angstroms.

8. The non-volatile memory of claim 1, wherein the second dielectric layer is formed by an ion implantation.

9. The non-volatile memory of claim 1, further comprising a pocket implantation on the first active region under the spacers.

10. The non-volatile memory of claim 9, wherein an implanting concentration of the pocket implantation has a range of about $1 \times 10^{13}$ to $5 \times 10^{14}/cm^2$.

11. The non-volatile memory of claim 1, further comprising an LDD on the first active region under the spacers.

12. The non-volatile memory of claim 1, wherein a doping concentration of the LDD has a range of about $1 \times 10^{13}$ to $2 \times 10^{14}/cm^2$.

13. The non-volatile memory of claim 1, wherein the second active region further comprises a source/drain extension implantation adjacent to the source/drain on the second active region.

14. The non-volatile memory of claim 13, wherein an implanting concentration of the source/drain extension implantation in the second active region has a range of about $5 \times 10^{13}$ to $1 \times 10^{15}$ $cm^2$.

* * * * *